(12) United States Patent  (10) Patent No.: US 7,178,229 B2
Borland et al.  (45) Date of Patent: Feb. 20, 2007

(54) METHOD OF MAKING INTERLAYER PANELS

(75) Inventors: William J. Borland, Chapel Hill, NC (US); Saul Ferguson, Albuquerque, NM (US); Diptarka Majumdar, Cary, NC (US); Matthew C. Snogren, Littleton, CO (US); Richard H. Snogren, Ontario (CA)

(73) Assignee: E. I. du Pont de Nemours and Company, Wilmington, DE (US)

( * ) Notice: Subject to any disclaimer, the term of this patent is extended or adjusted under 35 U.S.C. 154(b) by 477 days.

(21) Appl. No.: 10/718,044

(22) Filed: Nov. 20, 2003

(65) Prior Publication Data

US 2005/0111206 A1  May 26, 2005

(51) Int. Cl.
    *H05K 3/30*  (2006.01)
(52) U.S. Cl. .............. 29/831; 29/825; 29/832; 29/833; 29/841; 29/847; 174/260; 361/763
(58) Field of Classification Search ............. 29/25.03, 29/620, 830–834, 841, 846, 847, 851, 825; 174/255, 260; 361/707, 793, 795, 761, 763; 378/34, 35, 205
See application file for complete search history.

(56) References Cited

U.S. PATENT DOCUMENTS

| 4,190,854 A | 2/1980 | Redfern |
| 5,426,850 A * | 6/1995 | Fukutomi et al. ............ 29/848 |
| 5,952,241 A * | 9/1999 | Baker et al. ................ 438/691 |
| 6,237,218 B1 | 5/2001 | Ogawa et al. |
| 6,317,023 B1 | 11/2001 | Felten |
| 6,597,757 B2 * | 7/2003 | Ida et al. ...................... 378/34 |
| 6,609,297 B1 * | 8/2003 | Hiramatsu et al. ........... 29/852 |
| 6,631,551 B1 | 10/2003 | Bowles et al. |
| 2002/0179329 A1 | 12/2002 | Fukuoka et al. |
| 2003/0154592 A1 | 8/2003 | Felten |

FOREIGN PATENT DOCUMENTS

| EP | 1 265 466 A | 12/2002 |
| EP | 1 307 079 A | 5/2003 |
| JP | 2-153589 | 6/1990 |
| JP | 2001-168491 | 12/1999 |
| JP | 2003-92460 | 5/2002 |

OTHER PUBLICATIONS

Felten, J., Ferguson, S., Embedded Ceramic Resistors and Capacitors in PWB—Process and Design, IPC Printed Circuits Expo, Long Beach, California, Mar. 2002.
Felten, J., Snogren, R., and Zhou, J., Embedded Ceramic Resistors and Capacitors in PWB: Process and Performance, Fall IPC Meeting, Orlando, Florida, Oct. 11, 2001.

(Continued)

*Primary Examiner*—Minh Trinh
*Assistant Examiner*—Donghai D. Nguyen

(57) ABSTRACT

Innerlayer panels are provided with high density fiducials during manufacture. The fiducials can be identified using X-rays without etching away portions of the innerlayer panel to expose the fiducials.

10 Claims, 4 Drawing Sheets

OTHER PUBLICATIONS

Borland, W., Felten, J., Thick Film Ceramic Capacitors and Resistors inside Printed Circuit Boards, 34th International Symposium on Microelectronics (IMAPS), Baltimore, MD., Oct. 9-11, 2001.

John Felten and Saul Ferguson, Embedded Ceramic Resistors and Capacitors for PWB, IP Printed Circuit Expo, San Diego, CA, Apr. 2000.

John J. Felten and Saul Ferguson, Ceramic Resistors and Capacitors Embedded in PWB, IPC, San Diego, Apr. 5, 2000.

John J. Felten and Saul Ferguson, Ceramic Resistors and Capacitors Embedded in PWB, IMAPS, Denver, Apr. 29, 2000.

John J. Felten and William J. Borland, Embedded Ceramic Passives in PWB: Process Development, IPC Printed Circuit Expo, Anaheim, CA, Apr. 2001.

John J. Felten and William J. Borland, Ceramic Resistors and Capacitors Embedded in PWB's, IPC Expo, Apr. 3, 2001.

William Borland, Designing for Embedded Passives, Printed Circuit Design, Aug. 2001.

Dr. Kim Fjeldsted and Stacey L. Chase, Embedded Passives: Laser Trimmed Resistors, CircuiTree, vol. 70, Mar. 2002.

William J. Borland and Saul Ferguson, Embedded Passive Components in Printed Wiring Boards, a Technology Review, To be published in CircuiTree Magazine, 2001.

Jiming Zhou, John D. Myers and John J. Felten, Embedded Passives Technology for PCBs: Materials, Design, and Process, IMAPS 2002 Conference, Denver, CO, Sep. 4-6, 2002.

John J. Felten, Electronic Circuits World Convention, Paper No. IPC31, Advanced Embedded Passives Technologies—Putting Ceramic Components into Organic PWBs.

William Borland, John J. Felten, Saul Ferguson, Alton B. Jones and Angela A. Lawrence, Embedded Singulated Ceramic Passives in Printed Wiring Boards, IMAPS Advanced Technology Workshop on Passive Integration, Ogunquit, ME, Jun. 19-21, 2002.

Richard C. Snogren, Embedded Passives, a Review, IPC Designers Learning Symposium, Oct. 3, 2002, Toronto ON, CN.

Patent Abstracts of Japan, vol. 1998, No. 06, Apr. 30, 1998 & JP 10 051143 A (Oki Purintetsudo Circuit KK), Feb. 20, 1998, Abstract.

Patent Abstracts of Japan, vol. 2000, No. 02, Feb. 29, 2000 & JP 11 330316 A (Nec Tohoku Ltd), Nov. 30, 1999, Abstract.

Patent Abstracts of Japan, vol. 2000, No. 22, Mar. 9, 2001 & JP 2001 135941 A (Matsushita Electric Works Ltd.), May 18, 2001, Abstract.

Patent Abstracts of Japan, vol. 2000, No. 16, May 8, 2001 & JP 2001 022099 A (Adtec Engineering Co. Ltd.), Jan. 26, 2001, Abstract.

* cited by examiner

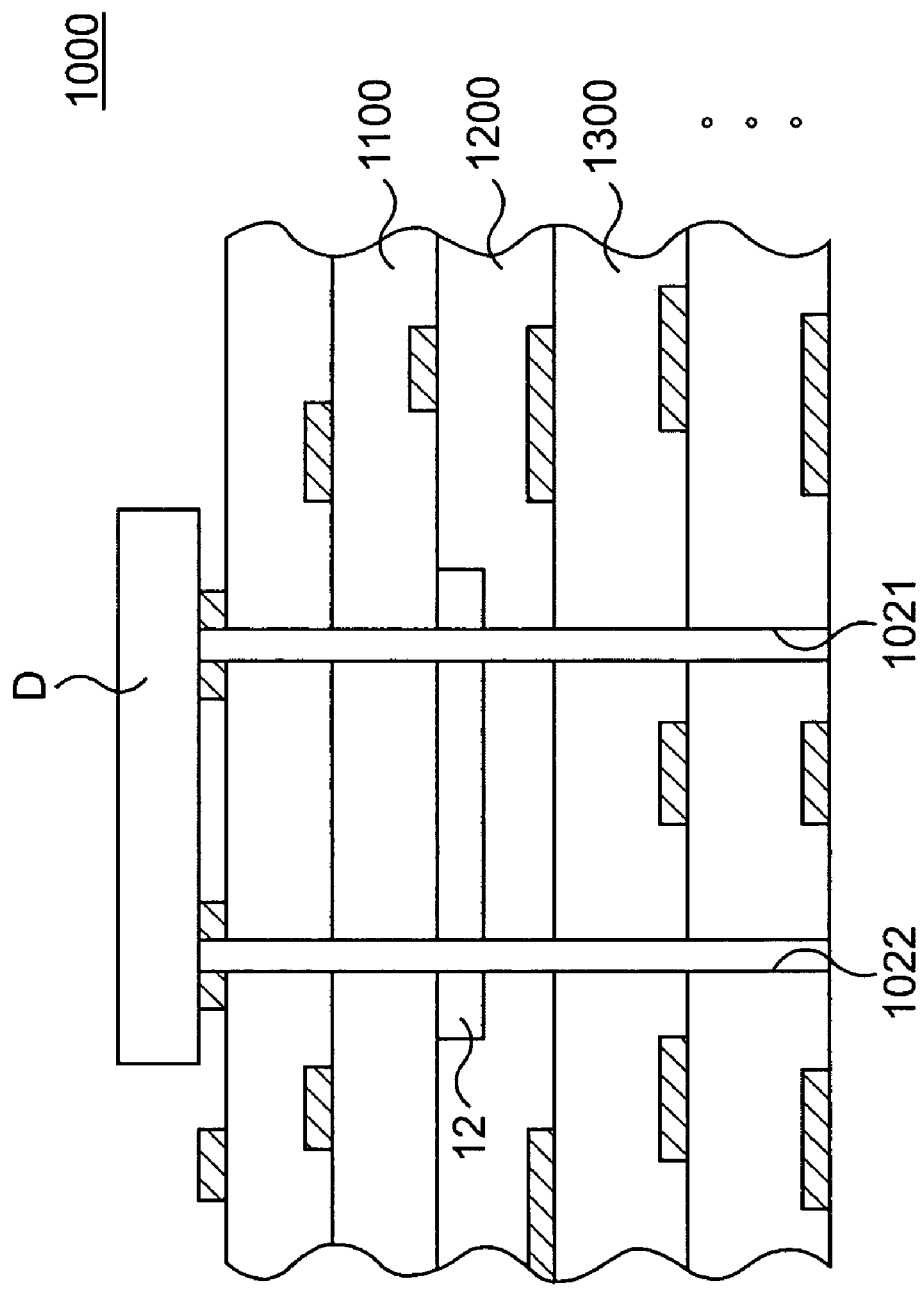

METHOD OF MAKING INTERLAYER PANELS

RELATED APPLICATIONS

This application is related to the application assigned U.S. Provisional Application Ser. No. 60/418,045, filed in the United States Patent and Trademark Office on Oct. 11, 2002, now converted to U.S. National application Ser. No. 10/651,367, filed in the United States Patent and Trademark Office on Aug. 29, 2003 and entitled "CO-FIRED CERAMIC CAPACITORS AND METHOD FOR FORMING CERAMIC CAPACITORS FOR USE IN PRINTED WIRING BOARDS," the application assigned, U.S. Provisional Application Ser. No. 60/433,105, filed on Dec. 13, 2002, now converted to U.S. National application Ser. No. 10/663,551, filed in the United States Patent and Trademark Office on Sep. 16, 2003, and entitled "PRINTED WIRING BOARDS HAVING LOW INDUCTANCE EMBEDDED CAPACITORS AND METHODS OF MAKING SAME," the application assigned U.S. Application Ser. No. 60/453,129, filed on Mar. 7, 2003, and entitled "PRINTED WIRING BOARDS HAVING CAPACITORS AND METHODS OF MAKING THEREOF," and the application assigned U.S. application Ser. No. 10/664,638, filed on Sep. 18, 2003, and entitled "HIGH TOLERANCE EMBEDDED CAPACITORS."

BACKGROUND

1. Technical Field

The technical field is registration of features in innerlayer printed wiring board panels. More particularly, the technical field includes X-ray alignment of embedded features to their electrical terminations and to other associated circuitry.

2. Background Art

The practice of embedding passive circuit elements and other features in printed wiring boards (PWB) allows for reduced circuit size, improved circuit performance and for additional semiconductors to be placed on the board surface. Features such as passive circuit elements and other components are typically embedded in panels that are stacked and connected by interconnection circuitry, the stack of panels forming the printed wiring board. The panels can be generally referred to as "innerlayer panels."

Passive circuit elements can be fabricated by a number of methods. "Formed-on-foil" elements such as resistors, for example, are formed by selectively depositing a thick-film resistor material on a metallic foil. Capacitors are formed on foil by depositing a thick-film dielectric and conductor combination. Such elements can be fired under thick-film firing conditions or cured at low temperatures. The resultant passive elements are then laminated to a dielectric and to a second foil, forming an innerlayer panel. The foils are disposed on the exterior of the innerlayer panel, and are used to form circuitry.

A printed wiring board is formed by photo-etching the foils on the exterior of the innerlayer panel to create circuitry, and then stacking and laminating the panels. The circuitry must be accurately positioned on the innerlayer panel in order to properly interconnect circuitry of the stacked panels in the printed wiring board. The circuitry is formed by punching register holes at specific locations in each innerlayer panel, and using register pins to position a photo-tool. The photo-tool is used to image circuitry on the exterior of the panels. The circuitry of the innerlayer panels is thereby correctly aligned during lamination.

Embedded circuitry, components and other features in an innerlayer panel must also be accurately interconnected to the circuitry on the exterior of the innerlayer panel. The alignment process is difficult, however, because embedded features are not visible. One alignment process involves the use of fiducials as position locators in an innerlayer panel. The fiducials are printed on a foil at the same time as embedded features during formation of the panel. Regions of the foil containing the fiducials are selectively etched away in the vicinity of the fiducials in order to expose the fiducials. Register holes are then punched in the innerlayer panel in known positions relative to the now visible fiducials. The register holes are used to position a photo-tool for further etching of the foil, which results in circuitry on the exterior of the panel.

Etching away the foil to expose fiducials allows for alignment of embedded features with other circuitry of the innerlayer panel. The etching processes, however, add time and cost to the alignment process.

SUMMARY

According to a first embodiment, a method of making an innerlayer panel comprises forming features and fiducials over a metallic foil. The locations of the fiducials are used to align embedded features with circuitry of the innerlayer panel. X-rays are used to determine the locations of the fiducials, which are distinguishable through the metallic foil. In one embodiment, the fiducials are formed from a thick-film paste containing a high-density element such as tungsten.

According to the first embodiment, embedded features can be accurately aligned to circuitry when constructing a printed wiring board. Because the locations of the fiducials can be determined using X-rays, there is no requirement for etching back parts of the innerlayer panel to expose the fiducials.

Those skilled in the art will appreciate the above stated advantages of the invention upon reading the following detailed description of the embodiments with reference to the below-listed drawings.

According to common practice, the various features of the drawings discussed below are not necessarily drawn to scale. Dimensions of various features and elements in the drawings may be expanded or reduced to more clearly illustrate the embodiments of the invention.

BRIEF DESCRIPTION OF DRAWINGS

FIG. 2 is a section view in front elevation of a portion of a printed wiring board.

DETAILED DESCRIPTION

Embodiments of the invention are directed to methods of making innerlayer panels and methods of forming printed wiring boards from the innerlayer panels. The innerlayer panels include fiducials that are used to align electrical terminations and associated circuitry with embedded features. The features can be, for example, formed-on-foil elements and embedded components or circuitry in the printed wiring board. The fiducials can be of a shape and density such that they are identifiable through the metallic foils of an innerlayer panel using X-rays.

According to a first embodiment, an innerlayer panel is formed by printing fiducials over a metallic foil using a paste containing a high-density material. The fiducials may be printed before or after the embedded features are printed on the foil. The locations of the high-density paste fiducials can be identified through the metallic foil using X-rays. A method of making an innerlayer panel according to the first embodiment is described below with reference to FIGS. 1A–1E.

Figures 1A, 1B:
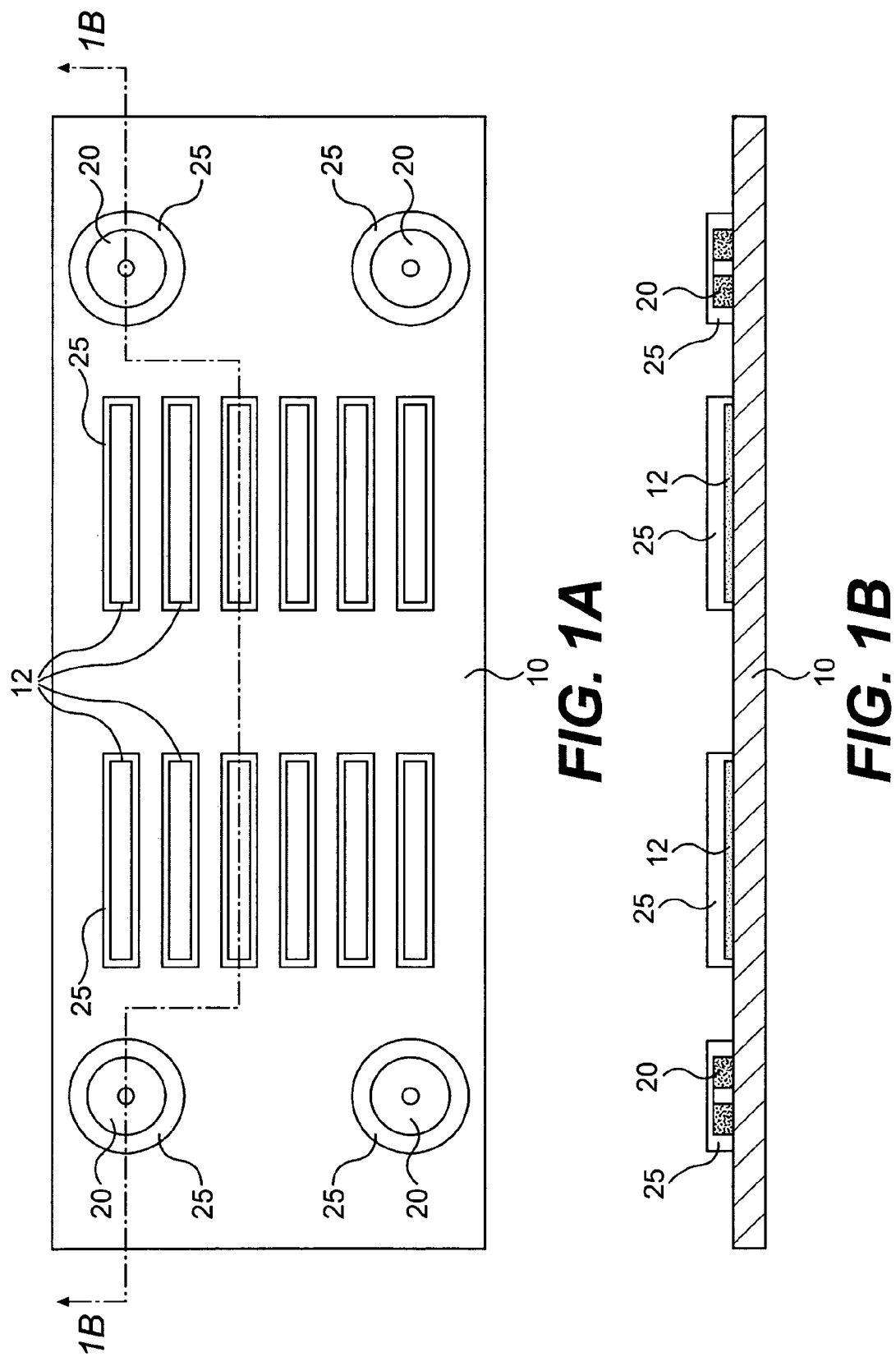
FIG. 1A is a top plan view of a first stage of manufacture of an innerlayer panel according to a first embodiment.
FIG. 1B is a section view in front elevation taken on line 1B—1B in FIG. 1A.

FIG. 1A is a top plan view of a first stage of manufacture of an innerlayer panel. FIG. 1B is a section view taken on line 1B—1B in FIG. 1A. In FIGS. 1A and 1B, a metallic foil 10 is provided. The foil 10 may be of a type generally available in the industry. For example, the foil 10 may be copper, copper-invar-copper, invar, nickel, nickel-coated copper, or other metals. Preferred foils include foils comprised predominantly of copper, such as, for example, reverse-treated copper foils, double-treated copper foils, and other copper foils commonly used in the multilayer printed circuit board industry. The thickness of the foil 10 may be in the range of, for example, about 1–100 microns, preferably 3–75 microns, and most preferably 12–36 microns, corresponding to between about ⅓ oz and 1 oz copper foil.

Fiducials 20 are formed over the foil 10. The fiducials 20 can be formed by, for example, screen-printing. The fiducials 20 are formed such that they are discernible through the metallic foils of the innerlayer panel using X-rays. The fiducials 20 can be formed in one or more screen-printing steps. Examples of dimensions and thicknesses for the fiducials 20 are discussed in detail below in Examples 1–4.

Next, features 12 are formed over the foil 10 in known positions with reference to the positions of the fiducials 20. The features 12 illustrated in FIGS. 1A and 1B are resistors, but any other forms of circuitry or components can be formed over the foil 10 according to the principles of the present invention. For example, passive circuit elements such as capacitors may also be formed over the foil 10. If the features 12 are resistors, the resistors 12 can be formed by, for example, screen-printing a thick-film paste such as is known in the art. If capacitors are formed, the foil 10 can be used to form a first electrode, and additional dielectric and conductive layers can be formed over the foil 10 using known processes and materials. Other features can also be formed over the foil 10.

The resulting article is then fired under thick-film firing conditions. The fiducials 20 and the features 12 can be fired at the same time or in separate steps. Encapsulant 25 may be formed over the features 12 and the fiducials 20 after firing. The encapsulant 25 serves to protect the fiducials 20 from the black oxide process. The black oxide process is an acid chemical process that causes copper to oxidize and create an oxide surface film. When a copper foil 10 is used, the oxide surface film improves adhesion of the foil 10 to epoxy prepreg during lamination. The black oxide process, however, can dissolve metals such as tungsten, which may be used in certain embodiments of the fiducials 20. The encapsulant can be an organic system, such as epoxy, that can be printed over the fiducials and cured at temperatures between 100° C. and 200° C. to achieve desired properties. The encapsulant can also be a thick-film glass composition, where its properties are achieved by firing under thick-film firing conditions. The same encapsulant 25 can be used to print over the features 12 and the fiducials 20, and the features 12 can be encapsulated in a single printing.

Figure 1C:
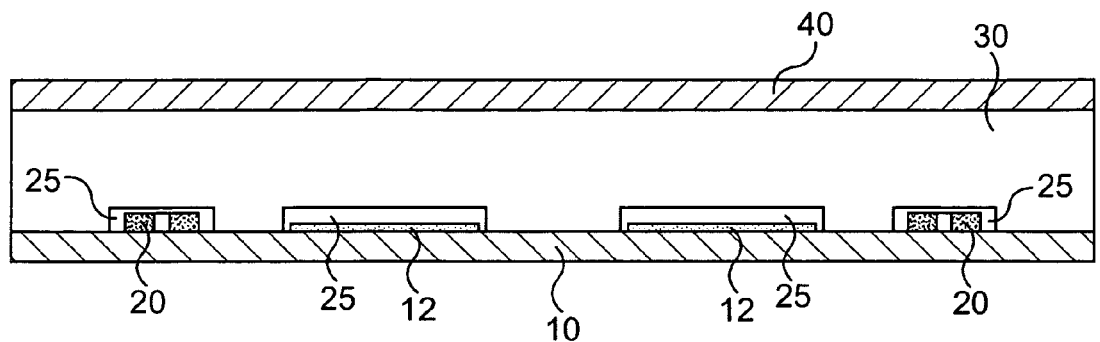
FIG. 1C is a section view in front elevation of a second stage of manufacture of an innerlayer panel according to the first embodiment.

FIG. 1C is a section view of the next stage of manufacture. Referring to FIG. 1C, the resulting article is laminated to a dielectric material 30. In FIG. 1C, the component face side of the foil 10 is laminated to the dielectric material 30. The lamination can be performed, for example, using FR4 prepreg in standard printing wiring board processes. For example, 106 epoxy prepreg may be used. Suitable lamination conditions are 185° C. at 208 psig for 1 hour in a vacuum chamber evacuated to 28 inches of mercury. A silicone rubber press pad and a smooth PTFE filled glass release sheet may be in contact with the foil 10 to prevent the epoxy from gluing the lamination plates together. A metallic foil 40 may be applied to the laminate material 30 to provide a second surface for creating circuitry.

Figure 1D:
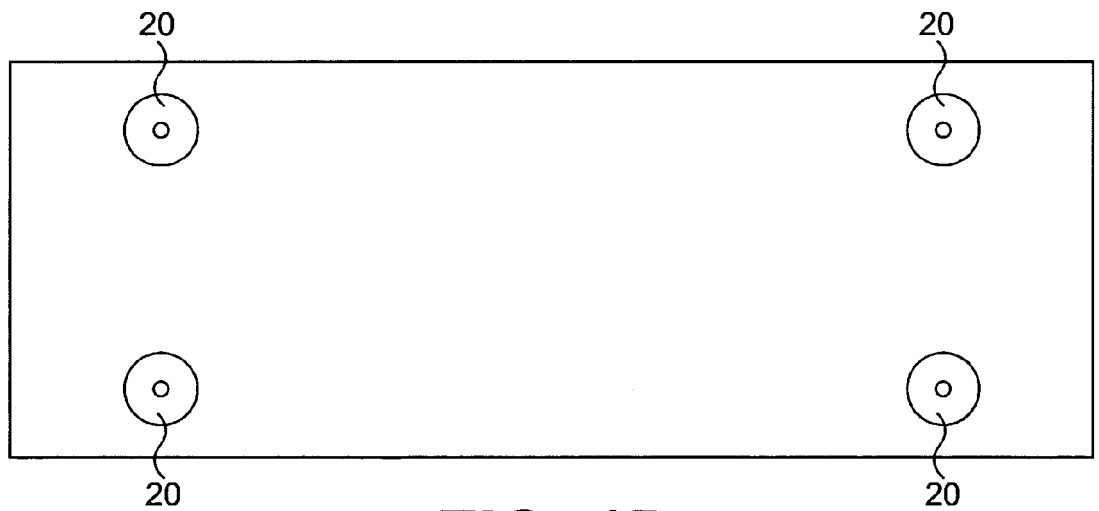
FIG. 1D illustrates an X-ray image of fiducials obtained during manufacture of the first embodiment.

After lamination, the resulting article is transferred to an X-ray drill machine. The X-ray drill machine locates the fiducials 20 using X-rays. FIG. 1D generally illustrates the image obtained by X-raying the laminate article. The fiducials 20 may be of such shape, size and density so that X-rays can be used to detect them through the foils 10 or 40. The features 12 do not have a density that is sufficiently different from the metallic foils 10 or 40 to be visible in the X-ray image.

Figure 1E:
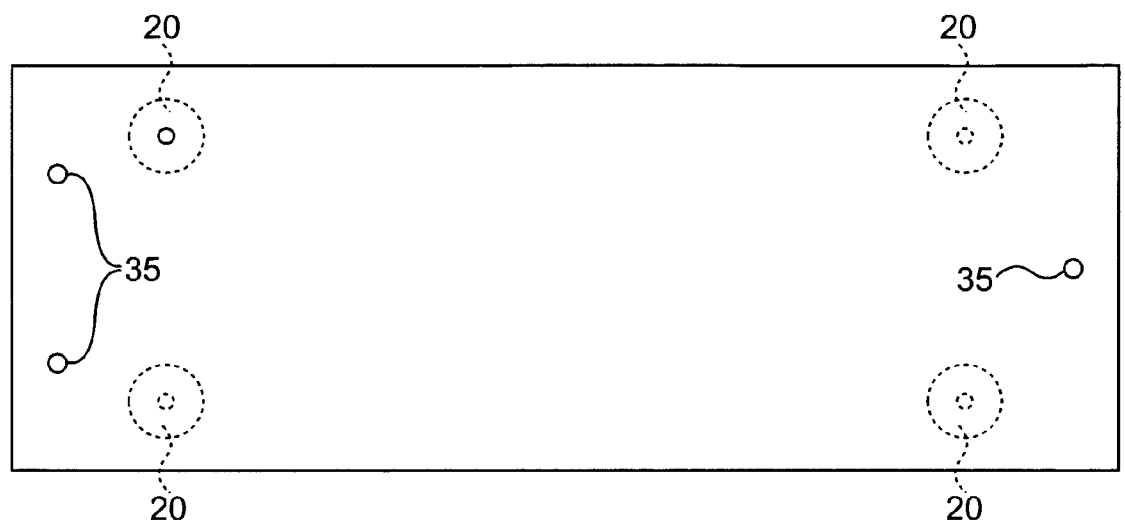
FIG. 1E illustrates punched register holes in the innerlayer panel during manufacture of the first embodiment.

FIG. 1E illustrates the formation of register holes 35 in the laminate article. The locations of the fiducials 20 are used to position the laminate article so that the register holes 35 may be formed in known positions relative to any features embedded in the laminate article. The register holes 35 may be formed by, for example, drilling or punching.

Figure 1F:
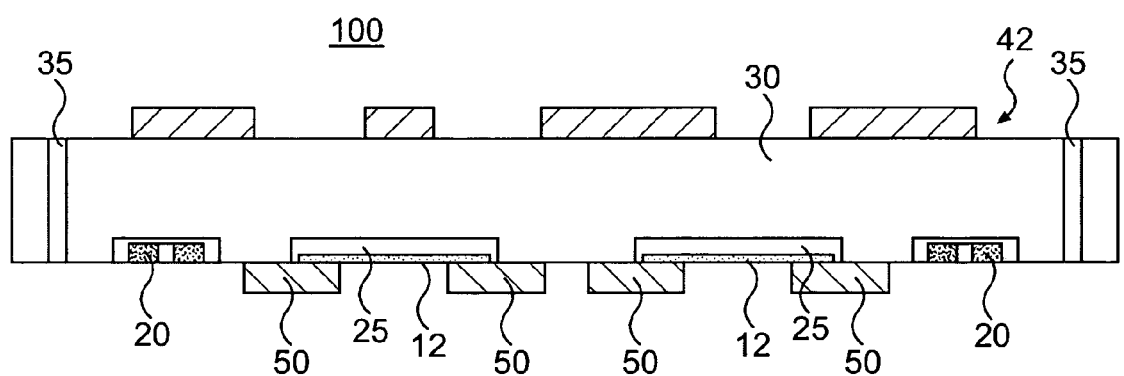
FIG. 1F is a section view in front elevation of a completed innerlayer panel, before incorporation into a printed wiring board.

FIG. 1F is a section view of the laminate article after etching the foils 10, 40 (reference numbers 10 and 40 are not used in FIG. 1E). An innerlayer panel 100 results from the etching process. Terminations 50 are formed from the foil 10, and additional circuitry 42 is formed from the foil 40. In forming the terminations 50 and the circuitry 42, a photoresist is applied to the foils 10, 40 and the foils 10, 40 are imaged, developed, etched and stripped using standard printing wiring board processing conditions. A photo-tool is used to image the foils 10, 40. The photo-tool is aligned using the register holes 35 along with register pins. The alignment step ensures that the imaging process and the subsequent etching process result in component foil terminations 50 and associated circuitry that are accurately aligned with the features 12.

According to the above embodiment, there is no need for etching steps to expose the fiducials 20, as is required in known alignment methods.

FIG. 2 illustrates a sectional view in front elevation of a portion of a printed wiring board 1000. The printed wiring board 1000 includes an innerlayer panel 1100 and additional innerlayer panels 1200, 1300 . . . The innerlayer panel 1100 is a schematic representation of the innerlayer panel 100 illustrated in FIG. 1E, after incorporation of the innerlayer panel 100 into the printed wiring board 1000. The printed wiring board 1000 may also include a power plane and a ground plane (not illustrated). An exemplary device D is shown as coupled to the connection circuitry 1021, 1022. The device D can be, for example, a semiconductor chip. The connection circuitry 1021, 1022 is also connected to a feature 12, which may represent any of the features 12 of the innerlayer panel 100. The feature 12 can be, for example, a capacitor coupled to the device D.

The innerlayer panels used to form the printed wiring board 1000 can be laminated together in a lamination pressing. The register holes 35 (shown in FIG. 1F) formed in the innerlayer panels can be used with register pins to align the panels during the lamination process. According to the present invention, the register holes may be formed without the necessity of etching to expose fiducials. The innerlayer panels can be bonded together using, for example, dielectric prepregs. The printed wiring board 1000 may be laminated in multiple stages. For example, subassemblies of innerlayer panels may be processed and laminated, and one or more subassemblies can subsequently be laminated together in order to form the finished printed wiring board 1000.

The connection circuitry 1021, 1022 can be formed, for example, after all of the innerlayer panels have been laminated together. Alternatively, connection circuitry can be formed in subassemblies of innerlayer panels or in individual panels prior to incorporating all of the innerlayer panels 1100, 1200, 1300 . . . into the completed printed wiring board 1000.

The connection circuitry between innerlayers can include, for example, one or more conductive vias, extending through all or a part of the printed wiring board 1000. In FIG. 2, the connection circuitry 1021, 1022 extend through the entire printed wiring board 1000, and have the form of through-hole conductive vias. The connection circuitry 1021, 1022 can be formed, for example, by laser or mechanically drilling holes through the laminated innerlayer panels. The holes are then plated with a conductive material. The resulting conductive vias 1021, 1022, which extend through the entire printed wiring board 1000, are typically referred to as "plated through-holes," and are usually formed after all of the innerlayer panels have been laminated together.

Connection circuitry may also extend through subassemblies of innerlayer panels or through individual panels. Conductive vias extending through only a part of the printed wiring board 1000 are commonly referred to as "buried vias." Buried vias are typically drilled and plated through a subassembly of innerlayer panels before the subassembly of innerlayer panels is incorporated into a printed wiring board by lamination. A small diameter conductive via formed in an individual innerlayer panel is commonly referred to as a "microvia," and may be used, for example, to terminate a capacitor within an innerlayer panel.

After all interconnections have been formed and all subassemblies of innerlayer panels or individual innerlayer panels have been laminated together and the outer layers formed, the printed wiring board 1000 is complete. In FIG. 2, the printed wiring board 1000 is illustrated as comprising the innerlayer panels 1100, 1200, 1300 . . . in a stacked configuration and laminated and connected by the connection circuitry 1021, 1022. Any number of innerlayer panels, however, may be included in a printed wiring board according to the present invention. In addition, only a small portion of the printed wiring board 1000 is illustrated in FIG. 2, and many more features and connection circuitry may be present in the printed wiring board 1000.

Each of the innerlayer panels can have a different design, including differing arrangements of circuit elements. The term "innerlayer panel" does not imply that the panels must be sandwiched in the interior of the printed wiring board 1000, and the innerlayer panels can also be located at the ends of the printed wiring board 1000.

The fiducials 20 illustrated in the above embodiments may be of any thickness, density and shape that allows for reliable identification of the fiducials 20 through the innerlayer panel 100. In general, the fiducials 20 should be of relatively high density. Use of high-density materials in the fiducials 20 allows for identification of the location of the fiducials by X-rays through lower density layers, such as the foils used to form features in the panel 100.

In one embodiment, the fiducials 20 are formed from a high-density paste. In the electronic materials industry, the term "paste" generally refers to a thick-film composition. Generally, thick-film pastes comprise finely divided particles of ceramic, glass, metal or other solids dispersed in polymers dissolved in an organic vehicle containing a mixture of plasticizer, dispersing agent and organic solvent. The glasses in the pastes can be, for example, Ca—Al borosilicates, Pb—Ba borosilicates, Pb-borosilicates, Mg—Al silicates, rare earth borates, and other similar glass compositions. The vehicles generally contain very small amounts of resin, such as high molecular weight ethyl cellulose, where only small amounts are necessary to generate a viscosity suitable for screen-printing. Solids are mixed with the vehicle, then dispersed on a three-roll mill to form a paste-like composition suitable for screen-printing. Any essentially inert liquid may be used as the vehicle. For example, various organic liquids, with or without thickening and/or stabilizing agents and/or other common additives, may be used as the vehicle.

One embodiment of a high-density paste includes tungsten powder and a small amount of glass dispersed in the organic vehicle. The organic vehicle has good burnout in a nitrogen atmosphere. This paste is particularly suitable for use with copper foils. The tungsten-containing high-density paste can be fabricated by, for example, dispersing tungsten powder in a screen-printing medium. Glass powder is an additive that promotes cohesion of the tungsten powder to itself and adhesion to the copper foil after firing at high temperatures.

The fiducials 20 may be of similar or slightly greater thickness to the features 12 formed over the foil 10 (see FIG. 1B). This arrangement is desirable because a screen-printing process can be used. Dried fiducial thicknesses favorable to detection by X-rays are generally 15 microns or greater.

Pastes comprising high-density metals are particularly suitable for forming fiducials. High-density metals are generally defined as having a density of 16 g/cc or higher. Tungsten, iridium, platinum, rhenium, tantalum, osmium, uranium or gold are examples of high density metals.

Tungsten is a preferred metal for forming fiducials because it does not alloy with copper. When a fiducial containing tungsten is formed over a copper substrate, there is an abrupt interface between the copper and the tungsten, which allows for better detection of the fiducial by X-rays. Tungsten is also relatively cheap and available in fine powder form.

The fine powder form of tungsten can be incorporated into a vehicle to form a printable paste. A tungsten-containing paste, for example, may be formed by mixing tungsten powder with glass powder. Upon firing, during manufacture of an innerlayer panel, the glass in the paste forms a bond between the tungsten and the copper substrate. A suitable firing temperature may be in the range of about 900° C.

A tungsten-containing paste may also be formulated as a "polymer thick-film" paste composition. Such a polymer thick-film paste composition may contain a high quantity of tungsten, such as greater than 80% by weight dispersed in an epoxy vehicle system. The polymer thick-film tungsten paste is preferable when polymer thick-film elements are being formed on copper foil. The polymer thick-film tungsten paste may be cured at between 150–200° C. for approximately ½–1 hour, for example, to cure and to harden the deposited paste. A polymer thick-film tungsten-containing paste is resistant to the black oxide process.

The following examples describe embodiments of the invention.

EXAMPLE 1

A paste of the following composition was formed:

| vehicle | 8.85% |
|---|---|
| TEXANOL ® solvent | 5.23% |
| glass powder | 27.50% |
| tungsten powder | 58.42% |

The vehicle was composed of 11% ethyl cellulose N200 dissolved in 89% TEXANOL® available from Eastman Chemical Co. The glass powder was composed of 5.4% $SiO_2$, 4.1% $Al_2O_3$, 78.1% PbO, and 12.4% $B_2O_3$ and was ground to a particle size of approximately 1 micron. The glass powder softening point was approximately 472° C. The tungsten powder was 1–5 microns in diameter. The inorganic solid content (glass and tungsten powder) was 85.92 weight %.

The tungsten-containing paste was used to print ring fiducials of approximately 1 cm outer diameter and ½ cm inner diameter. The fiducials were printed onto 1 oz (36 micron) copper foils having passive ceramic components printed thereon. This arrangement is generally illustrated by FIG. 1A. The ring fiducials were printed at specific locations with respect to the passive ceramic component positions. The fiducials were printed prior to printing the passive ceramic components, on the same side of the copper foil as the passive ceramic components.

The dried printed thickness of the tungsten-containing paste was approximately 21 microns. The passive ceramic features and the tungsten-containing fiducials on copper foil were fired in nitrogen at 900° C. for 10 minutes at peak. The fired tungsten-containing paste had good adherence to the copper foil. Epoxy protective encapsulants were applied to the passive ceramic components and to the printed fiducials. The component-side face of the foil was laminated to dielectric prepreg and to another copper foil, as shown in FIG. 1C.

The fiducials were clearly identifiable by X-ray. Register holes for use with register pins were drilled at desired locations after identifying the fiducial locations. After etching the foils, the position of the terminations with respect to the components was found to be good.

EXAMPLE 2

A paste of the following composition was formed:

| vehicle | 16.65% |
|---|---|
| TEXANOL ® solvent | 4.37% |
| glass powder | 25.26% |
| tungsten powder | 53.72% |

The vehicle was composed of 11% ethyl cellulose N200 dissolved in 89% TEXANOL®. The glass powder was composed of 5.4% $SiO_2$, 4.1% $Al_2O_3$, 78.1% PbO, and 12.4% $B_2O_3$ and was ground to a particle size of approximately 1 micron. The glass powder softening point was approximately 472° C. The tungsten-containing powder was 1–5 microns in diameter. The inorganic content of the paste was 78.98 weight %.

The tungsten-containing paste was used to print ring fiducials of approximately 1 cm outer diameter and ½ cm inner diameter. The fiducials were printed onto 1 oz (36 micron) copper foils having passive ceramic components printed thereon. This arrangement is generally illustrated by FIG. 1A. The ring fiducials were printed at specific locations with respect to the passive ceramic component positions. The fiducials were printed prior to printing the passive ceramic components, on the same side of the copper foil as the passive ceramic components.

The dried printed thickness of the tungsten-containing paste was approximately 15 microns. The passive ceramic features and the tungsten-containing fiducials on copper foil were fired in nitrogen at 900° C. for 10 minutes at peak. The fired tungsten-containing paste had good adherence to the copper foil. Epoxy protective encapsulants were applied to the passive ceramic components and to the printed fiducials. The component-side face of the foil was laminated to dielectric prepreg and to another copper foil, as shown in FIG. 1C.

In this case, the tungsten-containing fiducials were identifiable by X-ray. There was, however, some reduction in accuracy in locating the fiducial edges, which increased the difficulty in finding the appropriate position to drill the register holes.

EXAMPLE 3

A paste of the following composition was formed:

| vehicle | 29.51% |
|---|---|
| TEXANOL ® solvent | 4.8% |
| glass powder | 21.01% |
| tungsten powder | 44.67% |

The vehicle was composed of 11% ethyl cellulose N200 dissolved in 89% TEXANOL. The glass powder was composed of 5.4% $SiO_2$, 4.1% $Al_2O_3$, 78.1% PbO, and 12.4% $B_2O_3$ and was ground to a particle size of approximately 1 micron. The glass powder softening point was approximately 472° C. The tungsten powder was 1–5 microns in diameter. The inorganic content of the tungsten-containing paste was 65.68 weight %.

The tungsten-containing paste was used to print ring fiducials of approximately 1 cm outer diameter and ½ cm inner diameter. The fiducials were printed onto 1 oz (36 micron) copper foils having passive ceramic components printed thereon. This arrangement is generally illustrated by FIG. 1A. The ring fiducials were printed at specific locations with respect to the passive ceramic component positions. The fiducials were printed prior to printing the passive ceramic components, on the same side of the copper foil as the passive ceramic components.

The dried printed thickness of the tungsten-containing paste was approximately 10–12 microns. The passive ceramic features and the tungsten-containing fiducials on copper foil were fired in nitrogen at 90° C. for 10 minutes at peak. The fired tungsten-containing paste had good adherence to the copper foil. Epoxy protective encapsulants were applied to the passive ceramic components and to the printed fiducials. The component-side face of the foil was laminated to dielectric prepreg and another copper foil, as shown in FIG. 1C.

In this case, the fiducials were not identifiable by X-ray and register holes could not be drilled.

EXAMPLE 4

A paste of the following composition was formed:

| | |
|---|---|
| vehicle | 8.85% |
| TEXANOL ® solvent | 5.23% |
| glass powder | 20.92% |
| tungsten powder | 65.00% |

The vehicle was composed of 11% ethyl cellulose N200 dissolved in 89% TEXANOL. The glass powder was composed of 5.4% $SiO_2$, 4.1% $Al_2O_3$, 78.1% PbO, and 12.4% $B_2O_3$ and was ground to a particle size of approximately 1 micron. The glass powder softening point was approximately 472° C. The tungsten powder was 1–5 microns in diameter. The inorganic solid content was 85.92 weight %.

The tungsten-containing paste was used to print ring fiducials of approximately 1 cm outer diameter and ½ cm inner diameter. The fiducials were printed onto 1 oz (36 micron) copper foils having passive ceramic components printed thereon. This arrangement is generally illustrated by FIG. 1A. The ring fiducials were printed at specific locations with respect to the passive ceramic component positions. The fiducials were printed prior to printing the passive ceramic components, on the same side of the copper foil as the passive ceramic components.

The dried printed thickness of the tungsten-containing paste was approximately 20–22 microns. The passive ceramic features and the tungsten-containing fiducials on copper foil were fired in nitrogen at 900° C. for 10 minutes at peak. The fired tungsten-containing paste had poor adherence to the copper foil. The component-side face of the foil was laminated to dielectric prepreg and to another copper foil, as shown in FIG. 1C.

In samples where protective organic encapsulant was not applied to the tungsten paste, the tungsten-containing fiducials were etched away during the black oxide process.

In the case where an organic protective encapsulant was applied to the X-ray paste, the tungsten-containing fiducials survived the black oxide treatment and were clearly identifiable by X-ray after the passive ceramic components were laminated. X-ray register holes could therefore be drilled after lamination. The higher tungsten-to-glass ratio fiducials were identifiable by X-ray.

In the above embodiments, the dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers.

The features 12 may be capacitors, resistors or any other circuit element or components. There may also be features such as preformed via bumps that require alignment with circuitry.

The embodiments described in this specification have many applications. For example, one or more of the capacitor embodiments can be used within organic printed circuit boards, IC packages, applications of such structures in decoupling applications, devices such as IC modules and devices or handheld device motherboards, and other applications.

Each of the innerlayer panels in the printed wiring board 1000 can have a different design, including differing arrangements of circuit elements.

The foregoing description illustrates and describes the preferred embodiments of the present invention. It is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the detailed description is not intended to limit the invention to the form disclosed herein. Also, it is intended that the appended claims be construed to include alternative embodiments.

What is claimed is:

1. A method of making an innerlayer panel, comprising:
   providing a metallic foil;
   forming at least one fiducial over the foil;
   forming at least one feature over the foil;
   applying a dielectric over the at least one feature and over the at least one fiducial, thereby embedding the at least one fiducial and the at least one feature; and identifying the location of the at least one fiducial using X-rays,
   further comprising:
   applying a second foil to the dielectric before identifying the location of the at least one fiducial;
   forming at least one register hole in the innerlayer panel according to the identified location of the at least one fiducial;
   positioning a photo-tool according to the location of the at least one register hole;
   imaging the foils with the photo-tool; and
   etching the foils, wherein etching results in terminations for the embedded at least one feature.

2. The method of claim 1, wherein providing a metallic foil comprises:
   providing a foil comprising copper.

3. The method of claim 1, wherein forming at least one fiducial comprises: forming at least one fiducial comprising tungsten.

4. The method of claim 3, wherein the at least one fiducial is formed from a paste containing:
   glass; and
   tungsten in excess of 53% by weight.

5. The method of claim 3, wherein:
a dried print thickness of the at least one fiducial is at least 15 microns.

6. The method of claim 1, wherein:
forming at least one feature and forming at least one fiducial comprise at least one firing step.

7. The method of claim 1, wherein:
forming at least one feature and forming at least one fiducial comprise curing of a thick-film polymer paste.

8. The method of claim 1, wherein:
the at least one feature comprises at least one capacitor or resistor.

9. The method of claim 1, further comprising:
applying an encapsulant over the at least one fiducial prior to applying the dielectric.

10. The method of claim 9, wherein: the dielectric is a prepreg.

* * * * *